(12) United States Patent
Tsapatsis et al.

(10) Patent No.: US 11,344,850 B2
(45) Date of Patent: May 31, 2022

(54) NANOCOMPOSITE MEMBRANES AND METHODS OF FORMING THE SAME

(71) Applicants: Michael Tsapatsis, Baltimore, MD (US); Xiaoli Ma, Pleasant Prairie, WI (US)

(72) Inventors: Michael Tsapatsis, Baltimore, MD (US); Xiaoli Ma, Pleasant Prairie, WI (US)

(73) Assignees: Michael Tsapatsis, Baltimore, MD (US); Xiaoli Ma, Pleasant Prairie, WI (US)

( * ) Notice: Subject to any disclaimer, the term of this patent is extended or adjusted under 35 U.S.C. 154(b) by 381 days.

(21) Appl. No.: 16/172,581

(22) Filed: Oct. 26, 2018

(65) Prior Publication Data

US 2019/0168173 A1 Jun. 6, 2019

Related U.S. Application Data

(60) Provisional application No. 62/695,168, filed on Jul. 8, 2018, provisional application No. 62/578,229, filed on Oct. 27, 2017.

(51) Int. Cl.
*C23C 16/44* (2006.01)
*C23C 16/40* (2006.01)
(Continued)

(52) U.S. Cl.
CPC ......... *B01D 69/148* (2013.01); *B01D 53/228* (2013.01); *B01D 67/0072* (2013.01);
(Continued)

(58) Field of Classification Search
None
See application file for complete search history.

(56) References Cited

U.S. PATENT DOCUMENTS 5,585,457 A * 12/1996 Newkome ................ B82Y 5/00
528/171
6,271,319 B1 8/2001 Baker
(Continued)

FOREIGN PATENT DOCUMENTS

WO WO 1995/029751 A1 11/1995
WO WO 2013/177199 A1 11/2013

OTHER PUBLICATIONS

Drobek, et al., An innovative approach for the preparation of confined ZIF-8 membranes by conversion of ZnO ALD layers, 2015, Journal of Membrane Science, vol. 475, pp. 39-46. (Year: 2015).*

(Continued)

*Primary Examiner* — Jonathan Miller
*Assistant Examiner* — Gabriel E Gitman
(74) *Attorney, Agent, or Firm* — Mueting Raasch Group

(57) ABSTRACT

A nanocomposite including a mesoporous, macroporous, or a combination thereof oxide and a zeolitic imidazolate framework (ZIF) that is filling the pores of the oxide to form a ZIF phase embedded and at least substantially confined mostly within the oxide. Methods of making nanocomposites including the steps of depositing an oxide in the pores of a mesoporous oxide; and further treating the resulting material with vapor, liquid, or supercritical $CO_2$ comprising an azole-based compound, a carboxylate based compound, or a combination thereof. Use of disclosed articles to separate propylene and propane in a mixture thereof.

5 Claims, 11 Drawing Sheets

(51) Int. Cl.

| | |
|---|---|
| B01D 69/14 | (2006.01) |
| C23C 16/455 | (2006.01) |
| B01D 53/22 | (2006.01) |
| B01D 67/00 | (2006.01) |
| B01D 69/02 | (2006.01) |
| B01D 71/06 | (2006.01) |
| B01D 71/02 | (2006.01) |
| C23C 16/04 | (2006.01) |
| B01D 69/10 | (2006.01) |
| C23C 16/56 | (2006.01) |
| B01D 69/08 | (2006.01) |

(52) U.S. Cl.
CPC ......... *B01D 67/0079* (2013.01); *B01D 69/02* (2013.01); *B01D 69/10* (2013.01); *B01D 71/028* (2013.01); *B01D 71/06* (2013.01); *C23C 16/045* (2013.01); *C23C 16/40* (2013.01); *C23C 16/407* (2013.01); *C23C 16/45525* (2013.01); *C23C 16/45555* (2013.01); *C23C 16/56* (2013.01); *B01D 69/08* (2013.01); *B01D 69/147* (2013.01); *B01D 71/025* (2013.01); *B01D 2256/24* (2013.01); *B01D 2257/7022* (2013.01); *B01D 2325/20* (2013.01)

(56) References Cited

U.S. PATENT DOCUMENTS

| | | | | |
|---|---|---|---|---|
| 2003/0168407 | A1 | 9/2003 | Kusakabe | |
| 2004/0194691 | A1* | 10/2004 | George | C08J 7/0423 117/84 |
| 2008/0237126 | A1* | 10/2008 | Hoek | B01D 71/56 210/637 |
| 2011/0027599 | A1* | 2/2011 | Hoek | B01D 71/56 428/476.3 |
| 2012/0310018 | A1 | 12/2012 | Lai | |
| 2015/0251139 | A1 | 9/2015 | Jeong | |
| 2016/0030893 | A1* | 2/2016 | Lind | B01D 71/48 210/650 |
| 2016/0184798 | A1 | 6/2016 | Nair | |
| 2017/0198393 | A1 | 7/2017 | Stassen | |

OTHER PUBLICATIONS

Drobek et al. (2015). An innovative approach for the preparation of confined ZIF-8 membranes by conversion of ZnO ALD layers. Journal of Membrane Science, 475, 39-46. (Year: 2015).*
Adhikari, "Structure and electronic properties of a continuous random network model of an amorphous zeolitic imidazolate framework (a-ZIF)" 2016 *J. Phys. Chem., C* 120:15362-15368.
Agrawal, "Solution-processable exfoliated zeolite nanosheets purified by density gradient centrifugation" 2013 *AIChE Journal*, 59:3458-3467.
Alcántara-Avila, "Optimal design of cryogenic distillation columns with side heat pumps for the propylene/propane separation" 2014 *Chem. Eng. Process. Process Intensif.*, 82:112-122.
Allendorf, "Nanoporous films: From conventional to the conformal" 2016 *Nature materials*, 15:255-257.
Americas Chemicals Outlook 2017, ICIS; 98 pages.
Brinker, *Sol-gel science: the physics and chemistry of sol-gel processing* (Academic Press, San Diego, CA, 1990). Cover page, title page and table of contents.
Brown, "Interfacial microfluidic processing of metal-organic framework hollow fiber membranes" Jul. 2014 *Science* 345:72-75.
Bux, "Zeolitic imidazolate framework membrane with molecular sieving properties by microwave-assisted solvothermal synthesis" 2009 *J. Am. Chem. Soc.*, 131:16000-16001.
Caballero, "Design of hybrid distillation-vapor membrane separation systems" 2009 *Ind. Eng. Chem. Res.*, 48:9151-9162.
Carolan, Chemical vapor deposition of yttria stabilized zirconia on porous supports. *Solid State Ionics* 25, 207-216 (1987).
Castoldi, "Modeling of the separation of propene/propane mixtures by permeation through membranes in a polymerization system" 2007 *Ind. Eng. Chem. Res.*, 46:1259-1269).
Chang, "A comparative study on thermal and hydrothermal stability of alumina, titania and zirconia membranes" 1994 *Journal of Membrane Science*, 91:27-45.
Drobek, "An innovative approach for the preparation of confined ZIF-8 membranes by conversion of ZnO ALD layers" 2015 *Journal of Membrane Science*, 475:39-46.
Eddaoudi, "Zeolite-like metal-organic frameworks (ZMOFs): design, synthesis, and properties" 2015 *Chem. Soc. Rev.*, 44:228-249.
Eldridge, "Olefin paraffin separation technology—a review" 1993 *Industrial and Engineering Chemistry Research*, 32:2208-2212.
Eum, "Fluidic Processing of High-Performance ZIF-8 Membranes on Polymeric Hollow Fibers: Mechanistic Insights and Microstructure Control" 2016 *Adv. Funct. Mater.*, 26:5011-5018.
Eum, ZIF-8 Membranes via interfacial microfluidic processing in polymeric hollow fibers: efficient propylene separation at elevated pressures. *ACS Appl. Mater. Interfaces*, 2016, 8, 25337-25342.
Furukawa, "The chemistry and applications of metal-organic frameworks" 2013 *Science* 341:1230444.
Galizia, "50th anniversary perspective: Polymers and mixed matrix membranes for gas and vapor separation: A review and prospective opportunities" 2017 *Macromolecules* 50:7809-7843.
"Global Polypropylene (PP) Market Report 2017: $100+ Billion Market Size, Demand Forecasts, Industry Trends and Updates 2016-2022—Research and Markets," May 30, 2017. Retrieved on Oct. 7, 2019 from the Internet. <URL: https://www.prnewswire.com/news-releases/global-polypropylene-pp-market-report-2017-100-billion-market-size-demand-forecasts-industry-trends-and-updates-2016-2022--research-and-markets-300465031.html>; 5 pages.
Gokhale, "A comparison of advanced distillation control techniques for a propylene/propane splitter" 1995 *Ind. Eng. Chem. Res.*, 34:4413-4419.
Gucuyener, "Ethane/ethene separation turned on its head: Selective ethane adsorption on the metal-organic framework ZIF-7 through a gate-opening mechanism" 2010 *J. Am. Chem. Soc.*, 132:17704-17706.
Hara, "Effect of temperature on synthesis of ZIF-8 membranes for propylene/propane separation by counter diffusion method" 2015 *J. Jpn. Pet. Inst.* 58:237-244.
Hara, "Thickness reduction of the zeolitic imidazolate framework-8 membrane by controlling the reaction rate during the membrane preparation" 2014 *J. Chem. Eng. Jpn.*, 47:770-776.
Hara, "ZIF-8 membranes prepared at miscible and immiscible liquid-liquid interfaces" 2015 *Microporous and Mesoporous Mater.* 206:75-80.
Hara, Diffusive separation of propylene/propane with ZIF-8 membranes, *J. Membr. Sci.* 2014, 450, 215-223.
Hara, Effect of solution concentration on structure and permeation properties of ZIF-8 membranes for propylene/propane separation. *J. Chem. Eng. Jpn.* 2016, 49, 97-103.
Hess, "MOF Channels within Porous Polymer Film: Flexible, Self-Supporting ZIF-8 Poly (ether sulfone) Composite Membrane" 2016 *Chemistry of Materials*, 28:7638-7644.
Jang, "Formation of ZIF-8 membranes inside porous supports for improving both their $H_2/CO_2$ separation performance and thermal/mechanical stability" 2017 *Journal of Membrane Science*, 540:430-439.
Jeon, "Ultra-selective high-flux membranes from directly synthesized zeolite nanosheets" 2017 *Nature* 543, 690-694.
Jogwar, "Dynamics and control of vapor recompression distillation" 2009 *J. Process Control*, 19:1737-1750.
Kim, "Numerical simulation of fixed-bed catalytic reactor for isopropyl alcohol synthesis" 1989 *Korean J. Chem. Eng.*, 6:99-104.
Kiss, "Towards energy efficient distillation technologies—Making the right choice" 2012 *Energy*, 47:531-542.
Kong, "Nanoscale MOF/organosilica membranes on tubular ceramic substrates for highly selective gas separation" 2017 *Energy Environ. Sci.*, 10:1812-1819.

(56) References Cited

OTHER PUBLICATIONS

Kookos, "Optimal design of membrane/distillation column hybrid processes" 2003 *Ind. Eng. Chem. Res.* 42:1731-1738.

Koros, "Water and beyond: Expanding the spectrum of large-scale energy efficient separation processes" 2012 *AIChE J.*, 58:2624-2633.

Kwon, Heteroepitaxially grown zeolitic imidazolate framework membranes with unprecedented propylene/propane separation performances. *Journal of the American Chemical Society* 2015, 137, 12304-12311.

Kwon, Highly propylene-selective supported zeolite-imidazolate framework (ZIF-8) membranes synthesized by rapid microwave-assisted seeding and secondary growth. *Chem. Commun.* 2013, 49, 3854-3855.

Kwon, Improving propylene/propane separation performance of zeolitic-imidazolate framework ZIF-8 Membranes. *Chem. Eng. Sci.* 2015, 124, 20-26.

Kwon, "In situ synthesis of thin zeolitic-imidazolate framework ZIE-8 membranes exhibiting exceptionally high propylene/propane separation" 2013 *J. Am. Chem. Soc.*, 135:10763-10768.

Kwon, Defect-induced ripening of zeolitic-imidazolate framework ZIF-8 and its implication to vapor-phase membrane synthesis. *Chemical Communications* 2016, 52, 11669-11672.

Lee, "High-flux zeolitic imidazolate framework membranes for propylene/propane separation by postsynthetic linker exchange" 2018 *Angew. Chem. Int. Ed.*, 57:156-161.

Lee, "Techno-economic feasibility study of membrane based propane/propylene separation process" 2017 *Chem. Eng. Process. Process Intensif.*, 119:62-72.

Li, "Zeolitic imidazolate frameworks for kinetic separation of propane and propene" 2009 *J. Am. Chem. Soc.*, 131:10368-10369.

Li, "Ultrathin metal-organic framework membrane production by gel-vapour deposition" 2017 *Nature Communications*, 406:1-8.

Lin, "Modelling and analysis of CVD processes in porous media for ceramic composite preparation" 1991 *Chem. Eng. Sci.*, 46:3067-3080.

Liu, "Gas transport properties and propylene/propane separation characteristics of ZIE-8 membranes" *J. Membr. Sci.* 2014, 451, 85-93.

Ma, "Microporous Inorganic and Composite Membranes for Energy Efficient Separations," Poster presented at 2017 AIChE Annual Meeting, Oct. 29, 2017, Minneapolis, MN; 1 page.

Ma et al., "All-vapor-phase processing of zeolitic imidazolate framework nanocomposite membranes for propylene/propane separation," 2017 AIChE Annual Meeting, Oct. 29, 2017-Nov. 3, 2017, Minneapolis, MN; 17 pages.

Ma et al., "Zeolitic imidazolate framework membranes made by ligand-induced permselectivation" Sep. 2018, *Science*, 361(6406):1008-1011.

Ma et al., "Vapor phase processing of zeolitic imidazolate framework membranes for propylene/propane separation," CGS Nanoporous Materials Seminar, Apr. 25, 2018, University of California, Berkeley; 19 pages.

Ma, "Zeolitic imidazolate framework membranes made by ligand-induced permselectivation for propylene/propane separation," American Chemical Society (ACS) National Meeting and Exposition, Mar. 31-Apr. 4, 2019, Orlando, FL; 19 pages.

Ma, "Fabrication of zeolitic imidazolate framework ZIF-8 membranes by ligand-induced permselectivation in vapor phase," North American Membrane Society (NAMS) 28th Annual Meeting, May 11-15, 2019, Pittsburgh, PA; 20 pages.

Ma et al., "Vapor phase processing of zeolitic imidazolate framework membranes," 2018 AIChE Annual Meeting, Oct. 28-Nov. 2, 2018, Pittsburgh, PA; 14 pages.

Ma et al., "Vapor phase processing of zeolitic imidazolate framework membranes," IPRIME Annual Meeting 2018, May 30, 2018, Minneapolis, MN; 16 pages.

Meckler et al., "Sub-micron Polymer-Zeolitic Imidazolate Framework Layered Hybrids via Controlled Chemical Transformation of Naked ZnO Nanocrystal Films," Chem Mater, 2015, 27:7673-7679.

Mittal, "A mathematical model for zeolite membrane module performance and its use for techno-economic evaluation of improved energy efficiency hybrid membrane-distillation processes for butane isomer separations" 2016 *J. Memb. Sci.* 520:434-449.

Mittal, "Bioethanol enrichment using zeolite membranes: Molecular modeling, conceptual process design and techno-economic analysis" 2017 *J. Memb. Sci.*, 540:464-476.

Motelica, Membrane retrofit option for paraffin/olefin separation—a technoeconomic evaluation. *Industrial and Engineering Chemistry Research* 2012, 51, 6977-6986.

Naidu, "A generalized methodology for optimal configurations of hybrid distillation-pervaporation processes" 2011 *Chem. Eng. Res. Des.*, 89:1348-1361.

Olujić, "Conceptual design of an internally heat integrated propylene-propane splitter" 2006 *Energy*, 31:3083-3096.

Pan, "Effective separation of propylene/propane binary mixtures by ZIF-8 membranes" 2012 *Journal of Membrane Science*, 390:93-98.

Pan, Improved ZIF-8 membrane: effect of activation procedure and determination of diffusivities of light hydrocarbons. *J. Membr. Sci.* 2015, 493, 88-96.

Park, "Exceptional chemical and thermal stability of zeolitic imidazolate frameworks" 2006 *Proc. Natl. Acad. Sci. USA*, 103:10186-10191.

Park, "Performance Study of multistage membrane and hybrid distillation processes for propylene/propane separation" 2017 *Can. J. Chem. Eng.*, 95:2390-2397.

Pham, "Gel-free secondary growth of uniformly oriented silica MFI zeolite films and application for xylene separation" 2013 *Angew. Chem. Int. Ed.*, 52:8693-8698.

Pinnau, "Solid polymer electrolyte composite membranes for olefin/paraffin separation" 2001 *J. Membr. Sci.*, 184:39-48.

Propane—phase change data, NIST Chemistry WebBook, SRD69. http://webbook.nist.gov/cgi/cbook.cgi?ID=C74986&Mask=4#Thermo-Phase. Accessed Sep. 4, 2019. 10 pgs.

Propene—phase change data, NIST Chemistry WebBook, SRD69. http://webbook.nist.gov/cgi/cbook.cgi?ID=C115071&Mask=4#Thermo-Phase. Accessed Sep. 4, 2019. 9 pgs.

Salgado-Gordon, "Technical and economic evaluation of the separation of light olefins (ethylene and propylene) by using π-complexation with silver salts" 2011 *Ciencia, Tecnol. Y Futur.*, 4:73-88.

Schneider, "Heat integration complicates heat pump troubleshooting: An engineering review discovered the root-cause of the problem, saving a considerable capital expenditure," May 2002 *Hydrocarbon Processing*, 81:53-56.

Schneider, "Heat integration complicates heat pump troubleshooting," Stratus Engineering, Inc., Copyright 2001, 14 pages.

Shamiri, "Experimental and modeling analysis of propylene polymerization in a pilot-scale fluidized bed reactor" 2014 *Ind. Eng. Chem. Res.* 53, 8694-8705.

Shenvi, "Energy efficiency limitations of the conventional heat integrated distillation column (HIDiC) configuration for binary distillation" 2011 *Ind. Eng. Chem. Res.*, 50:119-130.

Sholl, "Seven chemical separations to change the world" 2016 *Nature*, 532:435-437.

Stassen, "Chemical vapour deposition of zeolitic imidazolate framework thin films" 2016 *Nature materials*, 15:304-310.

Tanaka, Grain size control of ZIF-8 membranes by seeding-free aqueous synthesis and their performances in propylene/propane separation. *Journal of Membrane Science* 2017, 544, 306-311.

Tao, Melt-quenched hybrid glasses from metal-organic frameworks, *Adv. Mater.* 2017, 29, 1601705.

Tsapatsis, "A kinetic model of membrane formation by CVD of $SiO_2$ and $Al_2O_3$" 1992 *AIChE J.*, 38:847-856.

Venna, "Highly permeable zeolite imidazolate framework-8 membranes for $CO_2/CH_4$ separation" 2010 *J. Am. Chem. Soc.*, 132:76-78.

Xu, "Design of a Process for production of isopropyl alcohol by hydration of propylene in a catalytic distillation column" 2002 *Chem. Eng. Res. Des.*, 80:686-694.

Yao, "Zeolitic imidazolate framework composite membranes and thin films: synthesis and applications" 2014 *Chem. Soc. Rev.*, 43:4470-4493.

(56) References Cited

OTHER PUBLICATIONS

Yu, "ZIF-8 membranes with improved reproducibility fabricated from sputter-coated ZnO/alumina supports" 2016 *Chem. Eng. Sci.*, 141:119-124.
Zhang, "Unexpected molecular sieving properties of zeolitic imidazolate framework-8" 2012 *J. Phys. Chem. Lett.*, 3:2130-2134.
Zygula, "Design considerations for propylene splitters" AIChE Spring Meeting and Global Congress on Process Safety, Mar. 16, 2011, Chicago, IL; 3 pages.

* cited by examiner

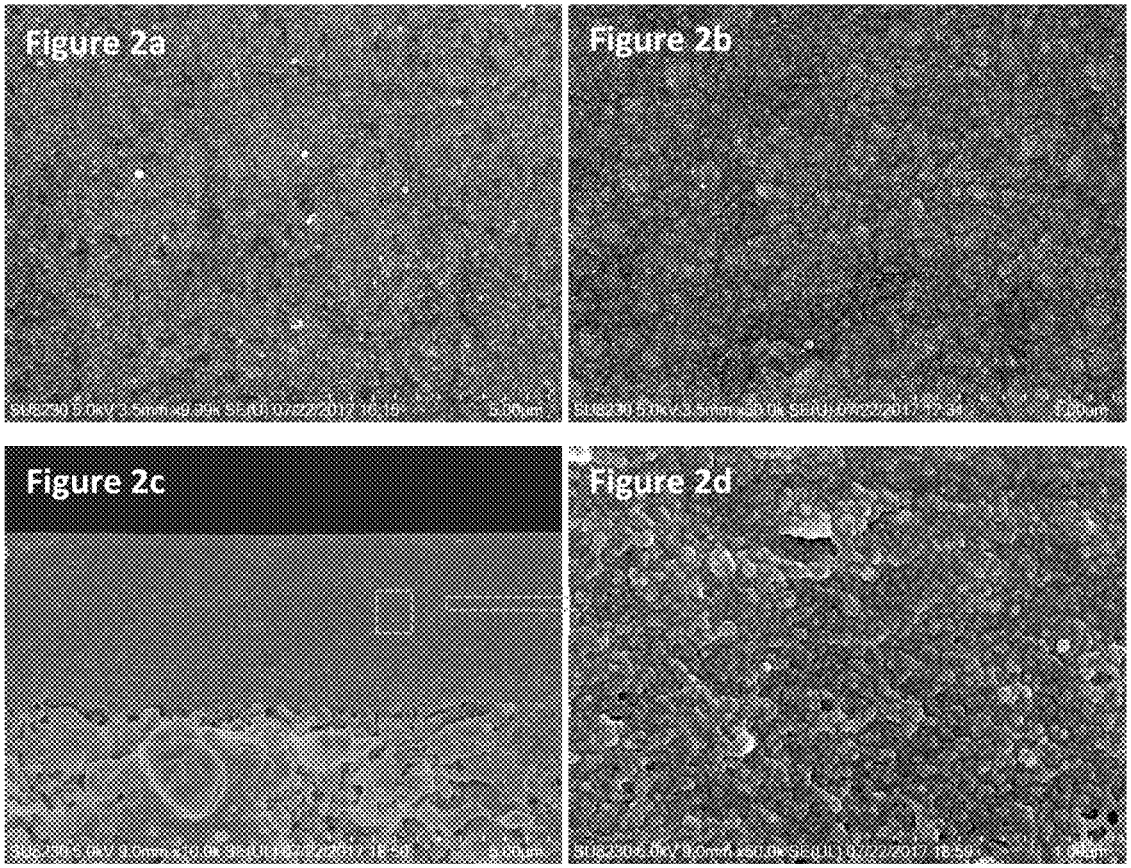

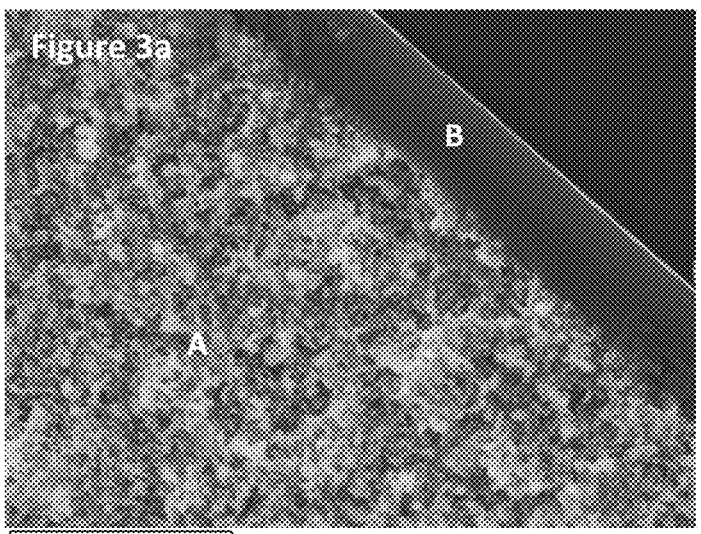
| A | |
|---|---|
| Element | Atomic % |
| C | 18.01 |
| O | 51.34 |
| Al | 30.65 |
| B | |
|---|---|
| Element | Atomic % |
| C | 28.20 |
| N | 1.90 |
| O | 40.78 |
| Al | 27.57 |
| Zn | 1.17 |
Al Kα1      O Kα1      Zn Lα1,2
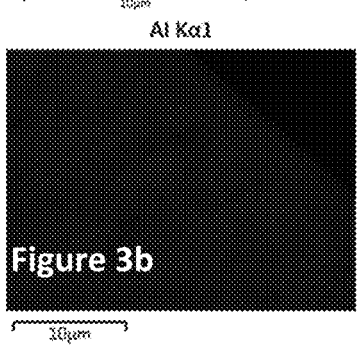 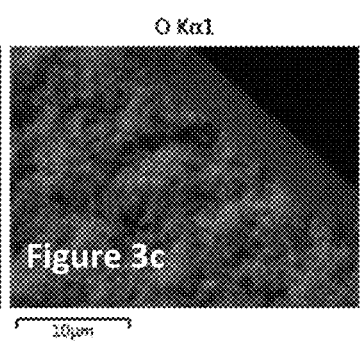 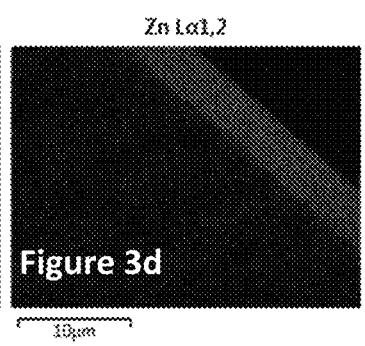

US 11,344,850 B2

NANOCOMPOSITE MEMBRANES AND METHODS OF FORMING THE SAME

PRIORITY

This application claims priority to U.S. Provisional Application No. 62/578,229, filed on Oct. 27, 2017 entitled "NANOCOMPOSITE MEMBRANES AND METHODS OF FORMING THE SAME" and 62/695,168 filed on Jul. 8, 2018 entitled "NANOCOMPOSITE MEMBRANES AND METHODS OF FORMING THE SAME", the disclosures of which are incorporated herein by reference thereto in their entirety.

GOVERNMENT RIGHTS

This invention was made with government support under SC0001015 awarded by the Department of Energy. The government has certain rights in the invention.

SUMMARY

Disclosed herein are nanocomposites including a mesoporous oxide and a zeolitic imidazolate framework (ZIF) that is filling the pores of the mesoporous oxide to form a ZIF phase embedded and at least substantially confined mostly within the mesoporous oxide.

Methods of making nanocomposites including the steps of depositing an oxide in the pores of a mesoporous oxide; and further treating the resulting material with vapor comprising an azole-based compound.

Also disclose are articles that include a macroporous α-alumina support and a gamma alumina layer on the alpha alumina support and a ZIF phase filling the pores of the gamma alumina sufficiently to create a selective membrane that can separate a mixture of gases, vapors or liquids Also disclosed are articles that include a macroporous support and a γ-alumina layer on the macroporous support and a ZIF phase filling the pores of the γ-alumina sufficiently to create a selective membrane that exhibits a mixture separation factor for a propylene/propane mixture larger than 50 and propylene flux larger than 0.001 mol/m$^2$-s or larger than 0.01 mol/m$^2$-s Use of disclosed articles to separate propylene from propane are also disclosed.

The above summary is not intended to describe each embodiment of the present disclosure. The details of one or more embodiments of the present disclosure are also set forth in the description below. Other features, objects, and advantages of the present disclosure will be apparent from the description and from the claims.

BRIEF DESCRIPTION OF THE DRAWINGS

The disclosure may be more completely understood in consideration of the following detailed description of various illustrative embodiments in connection with the accompanying drawings, in which:

FIGS. 2a, 2b, 2c and 2d show top view (FIGS. 2a and 2b) and cross-section (FIGS. 2c and 2d) scanning electron microscope (SEM) images of a membrane prepared by vapor phase ligand (methylimidazole) treatment of a ZnO deposit formed by ALD (200 cycles).

FIGS. 3a, 3b, 3c and 3d show energy dispersive spectroscopy (EDS) point and mapping analysis of the cross section of the ZIF nanocomposite membrane of FIGS. 2a, 2b, 2c and 2d. The tables show the elemental compositions at locations A and B. The mapping images show the distribution of Al (FIG. 3b), O (FIG. 3c) and Zn (FIG. 3d) across the cross-section of the membrane.

Figure 1:
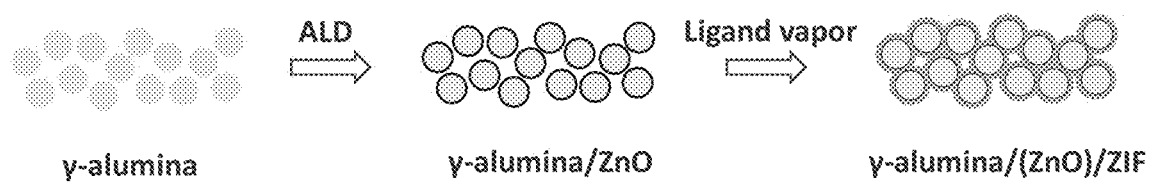
FIG. 1 schematically depicts an example of a method of forming a disclosed composite membrane that includes use of atomic layer deposition (ALD) to deposit ZnO on γ-alumina grains and then treatment with ligand vapor to form a zeolitic imidazolate framework (ZIF) on the ZnO.

It is to be understood that the embodiments may be utilized and structural changes may be made without departing from the scope of the disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

An all-vapor-phase processing method is disclosed for the fabrication of nanocomposite zeolitic imidazolate framework (ZIF) membranes. The method combines Atomic Layer Deposition (ALD) and vapor phase treatment. Depending on the number of ALD cycles, the obtained nanocomposite could exhibit low flux and no selectivity, whereas after ligand-vapor treatment, it can be partially transformed to ZIF and shows high separation performance. Because of the ligand induced transformation from a low-flux non-selective material to a selective membrane, the process is also named ligand-induced permselectivation (LIPS). Using this method, the microporous ZIFs can be deposited inside the mesopores, macropores, or both of a porous support. Illustrative supports can include ceramic materials, metal materials or polymer materials. The support could have virtually any geometry, including, for example flat, tubular, or hollow fiber. Specific illustrative nanocomposite membranes prepared using specific illustrative precursors show high separation factors and high flux for propylene/propane.

In the following description, reference is made to the accompanying drawing that forms a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

In illustrative embodiments, methods disclosed herein can be utilized to form particular nanocomposite membranes that show propylene/propane selectivity. In illustrative embodiments, disclosed nanocomposite membranes show propylene/propane selectivity.

Propylene/propane separation by cryogenic distillation is an important unit operation in the petrochemical industry. Due to small differences in volatility, cryogenic distillation is energy-intensive and requires columns with over 200 trays [1,2]. It has been proposed that significant energy and capital cost savings are possible by replacing or combining the distillation processes with membrane separations [3]. Among the many materials that have been explored, zeolitic imidazolate frameworks (ZIFs), particularly ZIF-8 and ZIF-67 [4-8], have emerged as promising materials due to the combination of adequate chemical/thermal stability and high propylene/propane selectivity. ZIF-8 membranes have been fabricated as continuous thin films on the outer or inner surface of porous ceramic [4-7] or polymeric supports [8-10] with solution-based methods including (1) in-situ counter diffusion; (2) seeded-secondary growth; and (3) interfacial microfluidic processing. Despite demonstrating good performance, all of the above methods involve solution-based processing steps that are difficult to reliably scale up. Moreover, the deposition of the membrane as a continuous film on the surface of the support leaves it vulnerable to mechanical damage and cracking due to support-membrane expansion coefficient mismatch.

An alternative to thin film membranes fabricated on the external surface of a porous support is to deposit the selective material so that it remains confined inside the support pores. This approach could offer certain advantages. For example, earlier work on zeolite membranes claimed that zeolite deposits formed inside a porous support can exhibit improved thermal and mechanical stability [11, 12]. Confinement may be especially advantageous for ZIFs because one can hypothesize that due to the constraints imposed by the rigid support, the intrinsic flexibility of ZIF frameworks could be suppressed. Fabrication of ZIF-8 membranes inside the pores of porous supports has been reported [13-15]. Jang et al. [13] prepared ZIF-8 membranes inside α-alumina supports by an in-situ counter diffusion synthesis in methanol. Drobek et al. [14] reported the fabrication of a nanocomposite ZIF-8 membrane by depositing ZnO thin films on the grains of a macroporous α-alumina support through atomic layer deposition (ALD) and converting ZnO to ZIF-8 in a 2-methylimidazole/methanol solution by solvothermal synthesis. These ZIF-8/α-alumina membranes showed low gas permeances due to the wide distribution of ZIF-8 grains along the thickness direction of alumina support. Hess et al. [15] developed a ZnO nanoparticle seeding-assisted process for the fabrication of ZIF-8/PES composite membranes. In this process, PES films with ZnO nanoparticles filled pores were incubated in a ligand solution containing methanol and dimethylacetamide (DMAc), followed by DMAc steaming and post-synthesis in water to seal the pinholes. More recently, MOF nanocrystals were synthesized in a liquid medium and mixed with organosilica polymer sol to prepare MOF/organosilica nanocomposite membranes on ceramic substrate [16]. The membrane fabrication processes of these ZIF-8 composite membranes all involved the use of at least one solvent, and the propylene/propane separation capability of these membranes has not been demonstrated.

To fabricate high performance membranes inside the pores of a support, one has to be able to completely close the pores of the support by the selective material (e.g., without leaving non-selective interfacial gaps with the pore walls, or other non-selective openings by incomplete pore plugging) over a thin region (e.g., avoid excessive thickening of the deposit, which can lead to flux reduction). This is difficult to achieve through conventional solution-based synthesis approaches due to the uncontrolled homogeneous/heterogeneous nucleation/growth and re-dissolution of membrane materials.

Kwon et al. [19] reported defect-induced ripening of compactly-packed ZIF-8 seed crystals in the presence of steam and ligand vapors to form continuous supported ZIF-8 thin films and membranes. The seed crystals were synthesized on alumina support in methanol by microwave synthesis. The vapors used for ripening were generated by heating an aqueous ligand solution. More recently, Li et al. [20] fabricated ultra-thin ZIF-8 membrane on the surface of polymeric hollow fiber supports by ligand vapor treatment of a Zn-gel, which was prepared from a Zn-based sol in ethanol. The prepared ZIF-8 membranes were washed by methanol for several times before gas permeation measurements. In addition to not being made by all-vapor synthesis, the ZIF-8 membranes reported in the above references were fabricated as thin film membranes on top of a porous support.

Disclosed herein is an all-vapor-phase synthesis method, which has been demonstrated by fabricating propylene/propane-selective nanocomposite membranes including zinc-imidazolate coordination compounds confined inside a mesoporous γ-alumina matrix. In such illustrative methods, zinc oxide was deposited inside the mesopores using an ALD process. Pore plugging of the mesopores was achieved by the expansive reactive transformation of part or all of the deposited zinc oxide to a zinc-imidazolate coordination compound (due to the many-fold difference in density between the oxide and the coordination compound) upon exposure to the vapor of azole (e.g., methylimidazole) ligands. The fabricated membranes exhibited high performance (flux and selectivity) for propylene/propane separation. The method is accomplished liquid-free. The ZIF membrane is confined within the pores of a mesoporous support and exhibited propylene/propane separation.

Disclosed herein are composite membranes, for example nanocomposite membranes. Disclosed membranes include a mesoporous oxide and a zeolitic imidazolate framework (ZIF) inside the pores of the oxide. In some embodiments, the ZIF is substantially filling the pores of the oxide, or entirely filling the pores of the oxide. In some embodiments, the ZIF can also be described as being embedded in the bulk of the oxide, e.g., embedded in the pores of the oxide. In some embodiments, the ZIF can be described as substantially confined with the pores, confined with the pores, or entirely confined within the pores. It is noted that in some embodiments part of the ZIF may extend above the top surface of the mesoporous oxide, below the bottom surface of the mesoporous oxide layer, or both, a substantial fraction of the mesopores within the mesoporous support become plugged by the deposit.

The mesoporous oxide can include alumina, silica, titania, zirconia, tin oxide, zinc oxide, or combinations thereof. In some embodiments, the mesoporous oxide can include alumina. In some embodiments, the mesoporous oxide can include γ-alumina. The mesoporous oxide of the composite membrane can be supported on a support structure or substrate. In some embodiments, a support substrate can include alumina, silica, aluminosilicate, stainless steel, titania, zirconia. In some embodiments, a support substrate can include α-alumina, for example.

The zeolitic imidazolate framework (ZIF) can include Zn, Co, In, Fe, Cu, Mn, Li, B, Cd, Hg, Pr, Mg, Al, Zr, Si, Hf, Ti, Ta or combinations thereof. In some embodiments, the ZIF can include Zn, Co, Zr or Fe. In some embodiments, the ZIF can be an amorphous ZIF, a crystalline ZIF, or a combination thereof. In some embodiments useful ZIFs can also be characterized by their topology. For example, in some embodiments useful ZIFs can include ZIF-1, ZIF-2, ZIF-3, ZIF-4, ZIF-5, ZIF-6, ZIF-7, ZIF-8, ZIF-9, ZIF-10, ZIF-11, ZIF-12, or combinations thereof; or ZIF-8 for example.

Disclosed composites can also include a layer of metal oxide located between the mesoporous oxide material and the ZIF. This layer can also be described as a non-imidazolated metal oxide between the mesoporous oxide and the ZIF. In some embodiments, the thickness of the metal oxide can range from 0.1 to 2 nm, for example.

In some particular illustrative embodiments, the mesoporous oxide can include γ-alumina and the ZIF can include crystalline ZIF-8, amorphous ZIF-8, or a combination of crystalline and amorphous ZIF-8.

Disclosed composite membranes can be useful for a number of applications, including for example separation applications (e.g., separating hydrogen and carbon dioxide, hydrocarbon mixtures, water and ethanol, water and alcohols other than ethanol such as propanol and butanol), catalysis applications, sensing and electronic devices, and drug delivery. In some embodiments, disclosed composite membranes can be useful as selective separation membranes that exhibit selective permeation properties for a mixture of gases, vapors, liquids, or combinations thereof. In some embodiments, disclosed composite membranes can be useful for separation applications, in some more specific applications separating hydrocarbon mixtures, and in even more specific applications for separating propylene from propane for example. In some embodiments, disclosed composite membranes can be useful for separating a mixture of propylene and propane and can exhibit a mixture separation factor for a propylene/propane mixture that is at least 50 and a propylene flux that is at least 0.001 mol/m$^2$-s, or even at least 0.01 mol/m$^2$-s.

Disclosed herein are methods of forming a composite membrane. Disclosed methods can be characterized as not including use of any solvent, or as an all-vapor phase method. Disclosed methods can include steps of depositing an oxide in pores of a mesoporous oxide using atomic layer deposition (ALD) for example and treating at least the deposited oxide with an azole containing compound.

Depositing an oxide in pores of an oxide can be accomplished by using ALD, chemical vapor deposition (CVD), physical vapor deposition (PVD), or combinations thereof for example.

The oxide can be mesoporous, microporous, or some combination thereof, for example.

In some embodiments ALD can be utilized to deposit an oxide in the pores of a mesoporous oxide. In some embodiments, a precursor to the oxide can be allowed to diffuse into the pores of a mesoporous oxide material (methods can optionally include formation of the mesoporous oxide material as well and in some embodiments formation of the mesoporous oxide material on a support substrate) and form a monolayer on the underlying mesoporous oxide material. The structure on the surface of the mesoporous oxide material at this point can be illustrated as Oxide-Metal Precursor, and specific examples includes -Oxide-Metal (Organic), —Al—O-Metal Precursor, —Al—O—Zn(Organic), —Al—O—Zn(CH$_2$CH$_3$), -Oxide-Zn(Organic), -Oxide-Zn(CH$_2$CH$_3$), -Oxide-Metal(CH$_2$CH$_3$), -Oxide-Zn (CH$_2$CH$_3$), and Al—O—Zn(CH$_2$CH$_3$). The Metal Precursor can include compounds that are commonly utilized for forming metal layers using ALD, for example.

After the oxide precursor has diffused into the pores and formed the monolayer, an oxidant is introduced in order to convert the oxide precursor to an oxide. The oxidant can include compounds that are commonly utilized for converting metal precursors into oxides, for example. Useful oxidants can include, for example water, hydrogen peroxide (H$_2$O$_2$), oxygen, or ozone.

The steps of diffusing oxide precursor and oxidants into the mesopores of the mesoporous oxide can be repeated as many times as desired to produce as many monolayers as desired on the insides of the pores of the mesoporous oxide material. The steps of diffusing oxide precursor and oxidants into the pores can be separated by a step of removing the non-adsorbed oxide precursor for example.

After the desired amount of metal oxide has been formed in the pores of the mesoporous oxide material, the next step includes treating at least the deposited oxide with a ligand. Illustrative ligands can include an azole containing compound, for example. Additionally, carboxylate organic compounds can be utilized as ligands. The ligands can be ligand vapors generated by sublimation of ligand solids; ligands dissolved in a liquid medium; or ligands solubilized in super critical $CO_2$.

Specific useful azole containing compounds can include any of imidazole, methyl-imidazole, benzimidazole, nitroimidazole, 2-chloro-1H-imidazole, dichloroimidazole, imidazole-2-carboxylic acid, 5,6-dimethylbenzimidazole, imidazole-2-carboxaldehyde, 2-ethylimidazole, 4-bromoimidazolate, 4,5-dichloroimidazolate, dimethylimidazolate or mixtures thereof. The step of treating the metal oxide with the azole containing compound causes the outermost layer of metal oxide to be converted Because of the larger volume taken up by a coordination compound formed by treating the metal oxide with an azole containing compound compared to the oxygen which it was formed from, the pores are substantially plugged by this step. In some embodiments, a zinc-imidazolate coordination compound can have a density that is at least five times smaller than that of zinc oxide.

In some embodiments it is possible that during the reactive transformation of the ALD-deposited oxide to ZIF, that mobile Zn species are generated leading to redistribution of the deposited Zn. This may allow for some of the ZIF deposit to spill over the top or bottom surface of the mesoporous oxide. However, a substantial fraction of the mesopores within the mesoporous support becomes plugged by the deposit.

Objects and advantages may be further illustrated by the following examples, but the particular materials and amounts thereof recited in these examples, as well as other conditions and details, should not be construed to unduly limit this disclosure.

EXAMPLES

Experiments
Preparation of Porous Supports:

Porous α-alumina disk supports (22 mm in diameter) were fabricated by a colloidal processing method reported before [21]. α-alumina powder (CR-6, Baikowski, average particle size of 500 nm) was added to water to make a 50 wt % suspension. The pH of the suspension was adjusted to ~2.2 by 1M $HNO_3$ solution. After horn sonication and degassing, approximately 4 g alumina suspension was transferred into an annular PTFE cylinder standing vertically on a 0.2 µm nylon membrane (Whatman). The backside of the nylon membrane was evacuated for 2 h under a vacuum of ~13 kPa to remove the water from the alumina suspension. The as-formed alumina disk green body was dried overnight and then sintered at 1050° C. for 3 h with a ramping rate of 2° C./min. The mesoporous γ-alumina layer was prepared on the surface of α-alumina support by a sol-gel method reported earlier [22]. 1M boehmite sol was prepared and mixed with 3 wt % PVA solution to make a coating sol. The γ-alumina sol was coated on the α-alumina surface by a slip-casting method. After drying in lab air overnight, the support was sintered at 450° C. for 3 h with a heating and cooling rate of 0.5° C./min.

All-Vapor-Phase Membrane Synthesis:

The nanocomposite membranes were fabricated by an all-vapor-phase approach. ZnO was deposited inside the pores of γ-alumina supports by an ALD process (Savannah series from Cambridge NanoTech). The support was placed inside the deposition chamber with the γ-alumina side facing upwards. The ALD was conducted at 125° C. using diethylzinc and water as vapor precursors. The number of deposition cycles was varied from 1 to 200 to change the amount of ZnO deposited. The γ-alumina support with ZnO deposited in it was then placed inside a liner with ~0.2 g solid 2-methylimidazole placed on the bottom. The liner was then sealed in an autoclave and heated at 125° C. for 24 h for the conversion of the ALD-deposited ZnO to a porous zinc-imidazolate coordination compound. After the growth, the membranes were activated under vacuum at 100° C. for 24 h before gas permeation measurements.

Gas Permeation Measurements:

Gas permeation/separation measurements were performed in a home-built constant volume variable pressure apparatus. The membrane was tightly sealed with Viton o-rings inside a stainless steel permeation cell. The cell was loaded in the permeation apparatus, followed by a 2 h evacuation of the whole system before each gas measurement. The feed pressure can be controlled by a pressure regulator. The rate of pressure change on the permeate side was used to calculate the gas permeance. For single gas permeation tests, the ideal selectivity/separation factor was determined by the ratio of permeances of the two pure compounds. For mixed gas measurement, an equimolar $C_3H_6/C_3H_8$ mixture at a total flow rate of 100 mL/min was provided on the feed side, and the permeate side was under vacuum. The gas composition was measured by gas chromatography (GC) equipped with a flame ionization detector (FID) coupled with a quantitative carbon detector (QCD) and a Plot-Q column. The separation factor was defined as the molar ratio of propylene/propane in the permeate divided by the molar ratio of propylene/propane in the feed. To evaluate the membrane performance under different pressures, the feed pressure was varied from 0 to 80 psig by a regulator on the retentate line.

Characterization:

X-ray diffraction (XRD) patterns were recorded using a Bruker-AXS (Siemens) D5005 diffractometer with a CuKα ($\lambda$, =0.15406 nm) radiation source. Scanning electron microscopy (SEM) images were acquired using a Hitachi SU8230 scanning electron microscope at an accelerating voltage of 5 kV. Samples for SEM analysis were coated with 5 nm Ir to improve conductivity. EDS analysis was performed by a JEOL 6500 scanning electron microscope. Samples were coated with 5 nm carbon for EDS analysis.

Results and Discussions

The γ-alumina support prepared in this work has a pore diameter distribution from 2 to 5 nm [22], allowing the diffusion of ALD precursor diethylzinc (DEZ) into the mesopores to react with the surface hydroxyl groups of γ-alumina grains forming —Al—O—Zn(CH$_2$CH$_3$). This monolayer reacts with the subsequently introduced water vapor to build the first layer of hydroxylated zinc oxide, completing the first cycle of ALD process. This process is repeated for a certain number of cycles (e.g., 1 to 200) to form a ZnO deposit on the γ-alumina grains as schematically illustrated in FIG. 1. Cross sectional analysis shows that ZnO is deposited throughout the γ-alumina layer (FIGS. 2a, 2b, 2c, 2d as well as FIGS. 3a, 3b, 3c and 3d).

Figure 4:
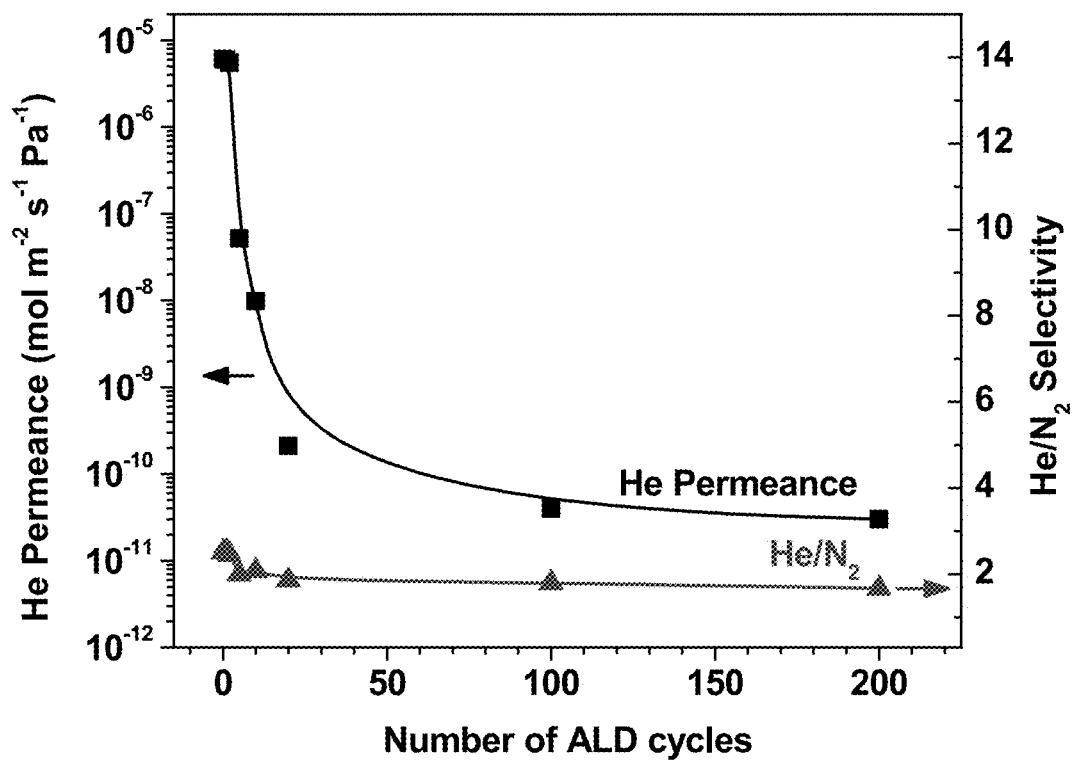
FIG. 4 is a graph showing helium (He) permeance and He/N$_2$ selectivity of γ-alumina supports after the deposition of ZnO by ALD, as a function of the number of ALD cycles.

The gas permeation properties of the γ-alumina support before and after ALD were measured (FIG. 4). A drastic reduction in He permeance was observed as the number of ALD cycles increased to up to 20. With an estimated 0.14 nm/cycle (from deposition on Si wafer), 20 cycles correspond to near pore filling of the ~5 nm pores. From SEM imaging and the permeation data, it appears that the ZnO deposits can be localized inside the γ-alumina pores. It is important to note that none of the supports after ZnO ALD showed any propylene/propane selectivity. Even after 200 ALD cycles, none of the supports showed any ZnO XRD peaks, indicating absence of crystallinity or low crystallinity of the deposit that can be attributed to the low deposition temperature.

Figure 5:
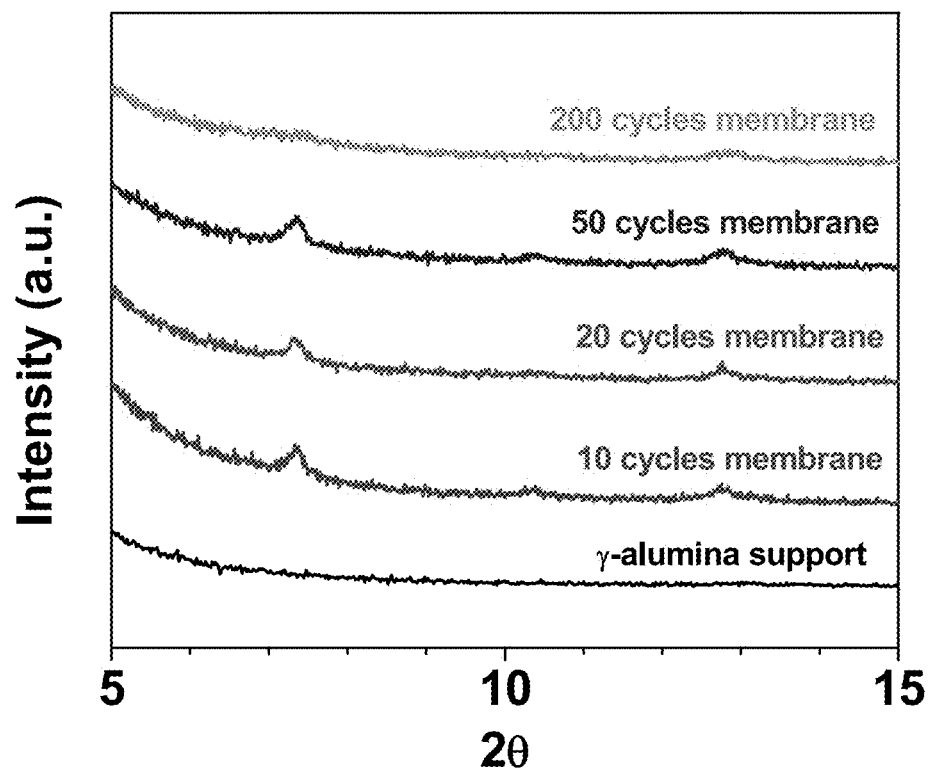
FIG. 5 shows X-ray diffraction (XRD) spectra of pure γ-alumina support and ZIF nanocomposite membranes prepared from ZnO deposits made by different number of ALD cycles.

After being treated with ligand vapor, depending on the number of ALD cycles used, no peaks or weak and broad ZIF-8 peaks are detected by XRD (FIG. 5). The low intensity and broad shape of the ZIF-8 peaks suggests low crystallinity and small particle size. Amorphous ZIFs have not been synthesized before by a bottom up approach [23, 24]. Here, ZIF formation inside the ~5 nm mesopores is likely to inhibit nucleation and crystallization encouraging the formation of amorphous deposits.

Figure 6A:
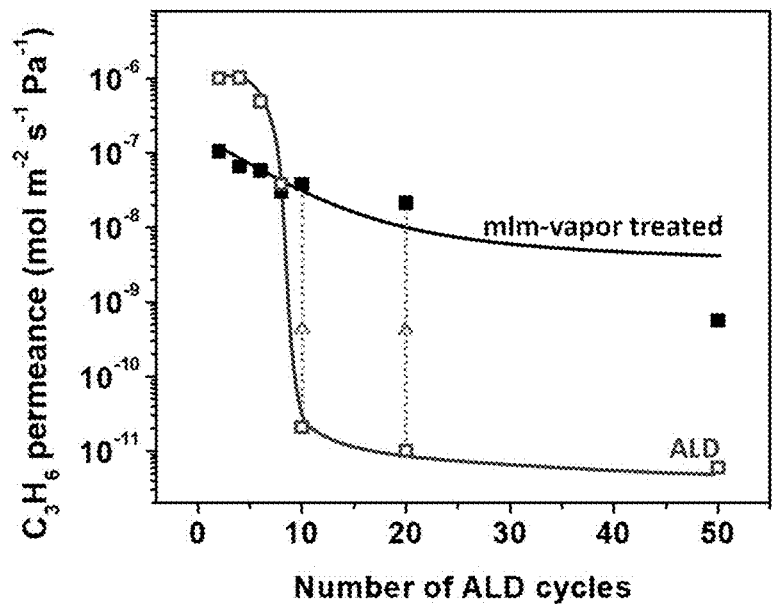
FIGS. 6A and 6B show a graph of propylene permeances and propylene/propane selectivities of the membranes as a function of the number of ALD cycles. Propylene permeances (6A) and propylene/propane single component selectivities (6B) of the ZIF-8/γ-alumina nanocomposite membranes as a function of the number of ALD cycles (solid symbols). Open symbols are values obtained from a support treated by the indicated cycles of ZnO ALD (before the ligand-vapor treatment).
Figure 6B:
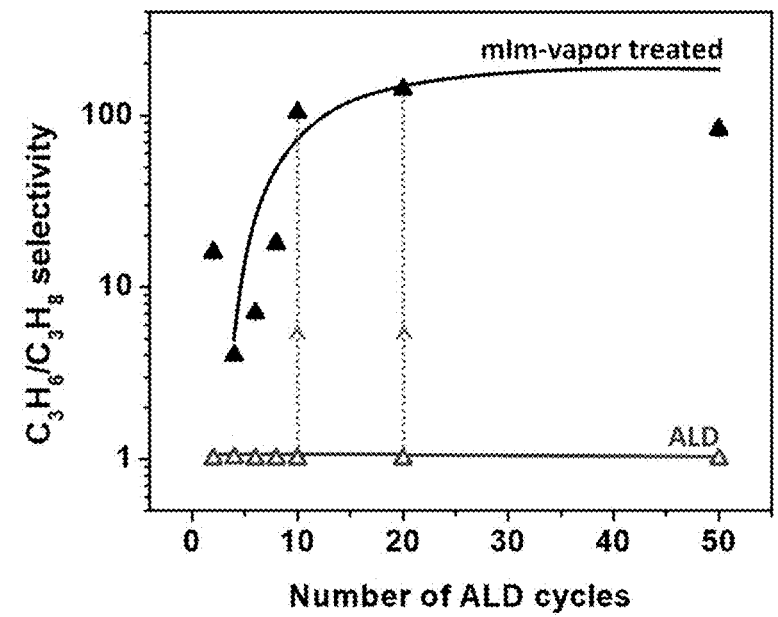
Figure 7:
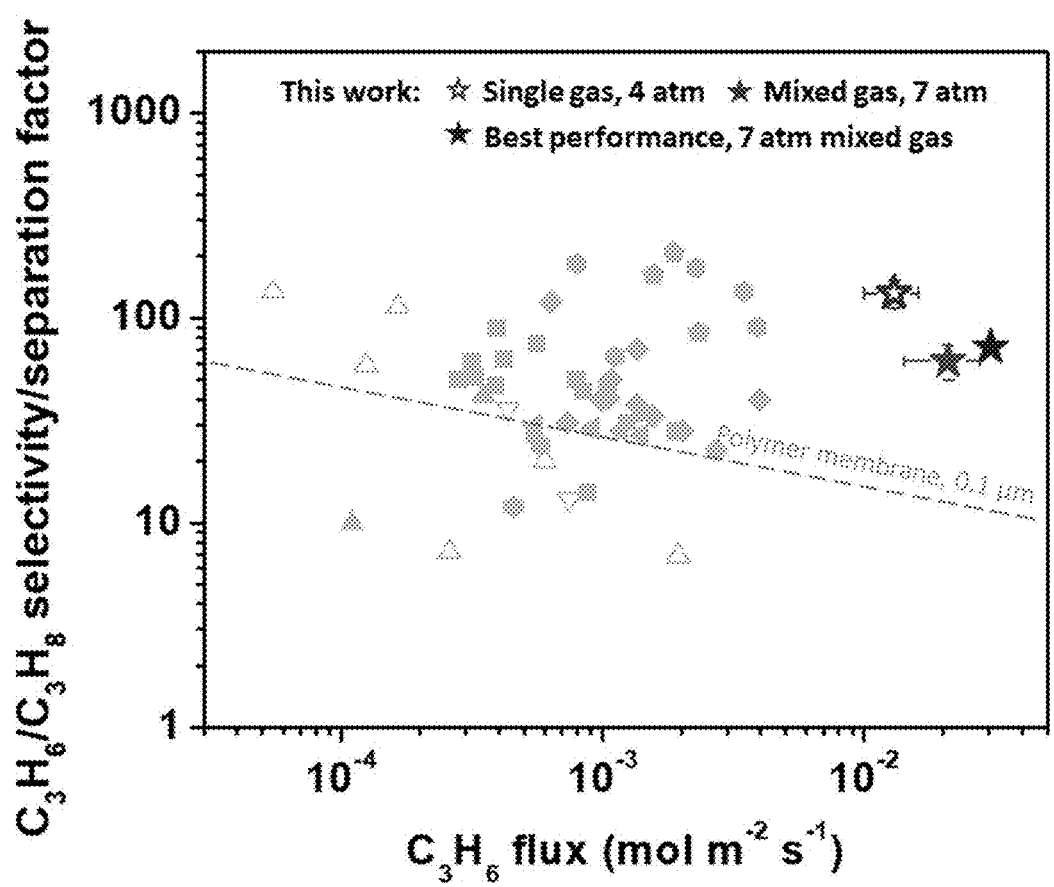
FIG. 7 shows a comparison of propylene/propane separation performances (propylene/propane selectivity (or separation factor) vs propylene flux) of ZIF membranes reported in the literature and in this work. Open and closed symbols represent separation data measured from single component and mixed gas permeation tests, respectively. All the data and detailed membrane preparation and gas permeation measurement conditions are listed in Table 2.

After carefully damaging the top layer by polishing, the membrane became non-selective to propylene/propane (Table 1), further confirming that the molecular sieving effect of the membrane is offered by the top ZIF/γ-alumina nanocomposites layer. It was determined that the number of ALD cycles used to form the ZnO deposits is an important factor determining the membrane performance. ZnO deposits of more than 20 cycles result in membranes with low permeance (FIGS. 6A and 6B). Membranes obtained from ZnO made by less than 10 ALD cycles showed relatively low selectivity. It was found that 10 and 20 cycles deposits reproducibly yield membranes with high permeance and high selectivity. Under a 50:50 propylene/propane mixture feed, and pressure as high as ~80 psig, the membranes made by the current method exhibited a record combination of high separation factor (>100) and high propylene flux (FIG. 7).

TABLE 1

| Condition | Sandpaper Grit | $C_3H_6/C_3H_8$ Ideal Selectivity |
|---|---|---|
| Original | / | 55.4 |
| After $1^{st}$ polishing | 1200 | 1.2 |
| After $2^{nd}$ polishing | 1200 | 1.0 |
| After $3^{rd}$ polishing | 1200 | 0.93 |
| After $4^{th}$ polishing | 1200 | 0.91 |
| After $5^{th}$ polishing | 600 | 1.0 |

Given that the pores of the γ-alumina layers are smaller than ~5 nm, and that the ZIF deposit is confined within these pores and exhibits no clear evidence of full crystallinity, the excellent separation performance is a surprising finding of this work.

Table 2 shows separation performance data, membrane preparation and gas permeation/separation measurement conditions of the membranes shown in FIG. 7. All the gas permeation measurements used a 50:50 propylene/propane mixture in the feed side. The fluxes were calculated from permeances and transmembrane pressure drop reported.

TABLE 2

| Substrate | Membrane fabrication method | Gas permeation method | Total feed pressure (kPa) | Total permeate pressure (kPa) | Permeate side condition | $C_3H_6$ Permeance ($\times 10^{-10}$ mol/m$^{-2}$s$^{-1}$Pa) | $C_3H_6$ flux ($\times 10^{-4}$ mol/m$^{-2}$s$^{-1}$Pa) | Separation factor | Symbols in Figure | Reference |
|---|---|---|---|---|---|---|---|---|---|---|
| α-alumina | Secondary growth | Wicke-Kallenbach | ~101 | ~0 | Sweeping, 100 mL/min He | 285 | 14.4 | 34 | ■ | [4] |
| | | | | | | 277 | 14.0 | 35 | | |
| | | | | | | 245 | 12.4 | 31 | | |
| | | | | | | 206 | 10.4 | 45 | | |
| | | | | | | 378 | 19.2 | 28 | | |
| α-alumina | Secondary growth | Wicke-Kallenbach | ~101 | ~0 | Sweeping, 100 mL/min Ar | 78 | 3.95 | 89 | | [26] |
| | | | | | | 110 | 5.57 | 75 | | |
| | | | | | | 167 | 8.46 | 44 | | |
| α-alumina | Secondary growth | Wicke-Kallenbach | ~101 ~200 ~400 | ~0 | Sweeping, 100 mL/min Ar | 62 54 43 | 3.14 5.47 8.74 | 61 27 14 | | [27] |
| α-alumina | Secondary growth | Wicke-Kallenbach | ~101 ~200 ~300 ~460 | ~0 | Sweeping, 100 mL/min $N_2$ | 110 89.4 76.4 60.6 | 5.57 9.07 11.8 14.0 | 30 28.9 28.1 26.9 | ◀ | [28] |
| α-alumina | Counter-diffusion | Time-lag | ~100 | ~0 | Vacuum | 25.0 | 1.25 | 59 | Δ | [29] |
| α-alumina | Counter-diffusion | Time-lag | ~100 | ~0 | Vacuum | 11.0 33.0 | 0.55 1.65 | 135 113 | | [30] |
| α-alumina | Counter-diffusion | Time-lag | ~100 | ~0 | Vacuum | 120 52.0 390 | 6.00 2.60 19.5 | 20 7.2 6.9 | | [31] |
| α-alumina | Counter-diffusion | Time-lag | ~100 | ~0 | Vacuum | 22.0 | 1.10 | 10 | ▲ | [32] |
| α-alumina | Counter-diffusion | Time-lag | ~100 | ~0 | Vacuum | 70.0 | 3.50 | 42 | | [33] |
| α-alumina | In-situ | Constant pressure variable volume | ~200 | ~100 | 1 atm of permeated gas | 86.8 149 | 4.34 7.45 | 36 13.1 | ▽ | [34] |
| α-alumina | Heteroepitaxial growth | Wicke-Kallenbach | ~101 | ~0 | Sweeping, 100 mL/min Ar | 461 370 309 | 23.3 18.7 15.7 | 84.8 209.1 163.2 | ● | [5] |
| α-alumina | In situ counter diffusion | Wicke-Kallenbach | ~101 | ~0 | Sweeping, 100 mL/min Ar | 213 | 10.8 | 50 | ◆ | [35] |
| α-alumina | Seeding + vapor-phase Ripening | Wicke-Kallenbach | ~101 | ~0 | Sweeping, 100 mL/min Ar | 125 | 6.33 | 120 | | [19] |

TABLE 2-continued

| Substrate | Membrane fabrication method | Gas permeation method | Total feed pressure (kPa) | Total permeate pressure (kPa) | Permeate side condition | $C_3H_6$ Permeance ($\times 10^{-10}$ mol/m$^{-2}$s$^{-1}$Pa) | $C_3H_6$ flux ($\times 10^{-4}$ mol/m$^{-2}$s$^{-1}$Pa) | Separation factor | Symbols in Figure | Reference |
|---|---|---|---|---|---|---|---|---|---|---|
| α-alumina | Microwave-assisted seeding and secondary growth | Wicke-Kallenbach | ~101 | ~0 | Sweeping, 100 mL/min Ar | 208<br>144 | 10.5<br>7.28 | 40.43<br>30.77 | | [36] |
| α-alumina | In situ counter diffusion | Wicke-Kallenbach | ~101 | ~0 | Sweeping, 100 mL/min Ar | 269<br>538<br>395<br>268<br>308<br>268<br>195 | 13.6<br>27.2<br>20.0<br>13.6<br>15.6<br>13.6<br>9.88 | 70.6<br>22.4<br>28<br>38<br>33.1<br>38<br>39.7 | | [37] |
| Polymer | Interfacial Microfluidic Processing | Wicke-Kallenbach | ~100<br>~400<br>~700<br>~850 | ~0 | Sweeping, Ar | 151<br>112<br>98.7<br>91.5 | 7.92<br>22.8<br>34.7<br>39.1 | 184.4<br>176.2<br>135<br>90.3 | ● | [38] |
| Polymer | Interfacial Microfluidic Processing | Wicke-Kallenbach | ~101 | ~0 | Sweeping, 100 mL/min Ar | 221 | 22.4 | 65 | | [39] |
| Polymer | Interfacial Microfluidic Processing | Wicke-Kallenbach | ~101 | ~0 | \ | 90.0 | 4.56 | 12 | | [8] |
| Polymer | Sol-gel + vapor treatment | Constant pressure variable volume | ~100<br>~900 | \<br>~100 | \<br>1 atm of permeated gas | 2800<br>2000 | 140<br>700 | 73.4<br>22.7 | ● | [20] |
| γ-alumina | All-vapor phase synthesis | Time-lag | ~400<br>~400<br>~400 | ~0 | Vacuum | 381<br>214<br>368 | 154<br>88<br>149 | 104<br>141<br>152 | ☆ | This work |
| | | Wicke-Kallenbach | ~700<br>~700<br>~700<br>~100<br>~100<br>~100 | ~0 | Sweeping, 120-200 mL/min N$_2$ | 449<br>456<br>849<br>621<br>880<br>1606 | 157<br>164<br>305<br>31<br>43<br>79 | 45<br>67<br>72<br>46<br>71<br>74 | ★ | |

ZIF-8 Membrane Made on Hollow Fibers by the LIPS Method

Figure 8:
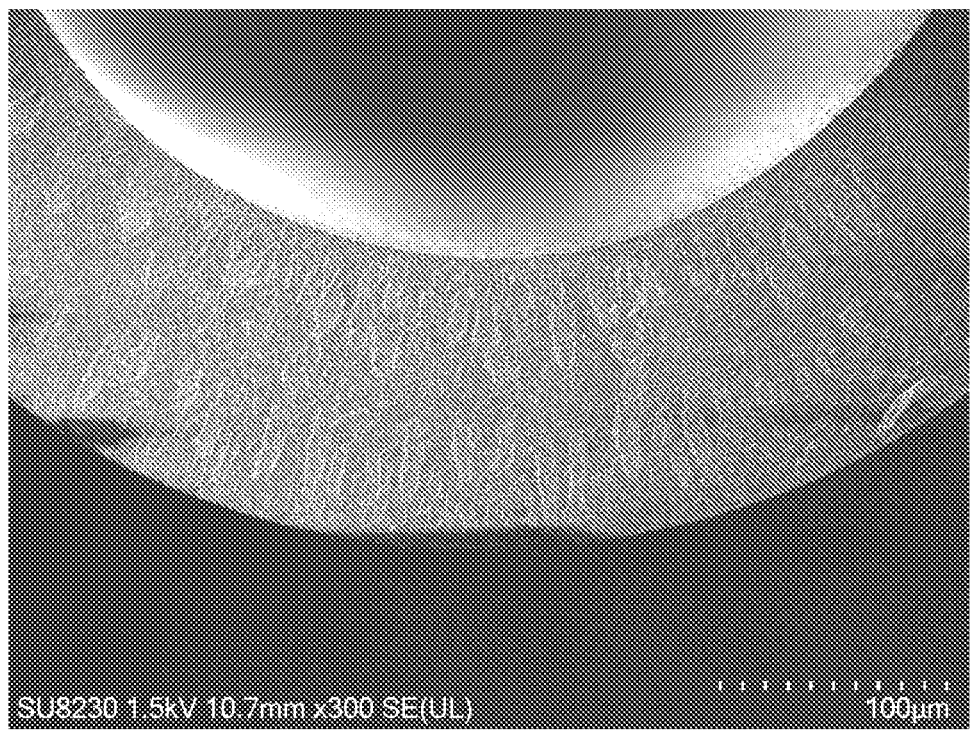
FIG. 8 shows a low magnification cross-sectional SEM image of fabricated α-alumina fiber.

Preparation of α-Alumina Hollow Fibers:

The α-alumina hollow fibers were prepared with a phase inversion followed by sintering method. Dope preparation procedure was as followed: 54.7 g of Al$_2$O$_3$, 38 g of 1-Methyl-2-pyrrolidone, 6.8 g of polyethersulfone, and 0.5 g of poly-vinylpyrrolidone were dissolved upon vigorous stirring for 4 h at 70° C. Detailed spinning condition was listed in Table 3. The raw fibers were then sintered at 873 K for 2 h followed by 6 h at 1773 K with a temperature ramping rate of 5 K/min. Fabricated fibers were of ~800 mm OD, ~160 mm wall thickness, and 35% porosity (FIG. 8).

TABLE 3

Spinning conditions for alumina hollow fibers.

| | |
|---|---|
| Dope composition (PES/NMP/Al$_2$O$_3$/PVP) (wt %) | 6.8/38.0/54.7/0.5 |
| Dope flow rate (ml/hr) | 120 |
| Bore fluid | DI-H$_2$O |
| Bore fluid flow rate (ml/hr) | 80 |
| Air gap (cm) | 3 |
| Take up rate (m/min) | /* |
| Operating temperature (K) | RT (~298) |
| Quench bath temperature (K) | 298 |

*the alumina raw fibers were collected from bottom of the bath instead of using the take-up drum.

Figure 9:
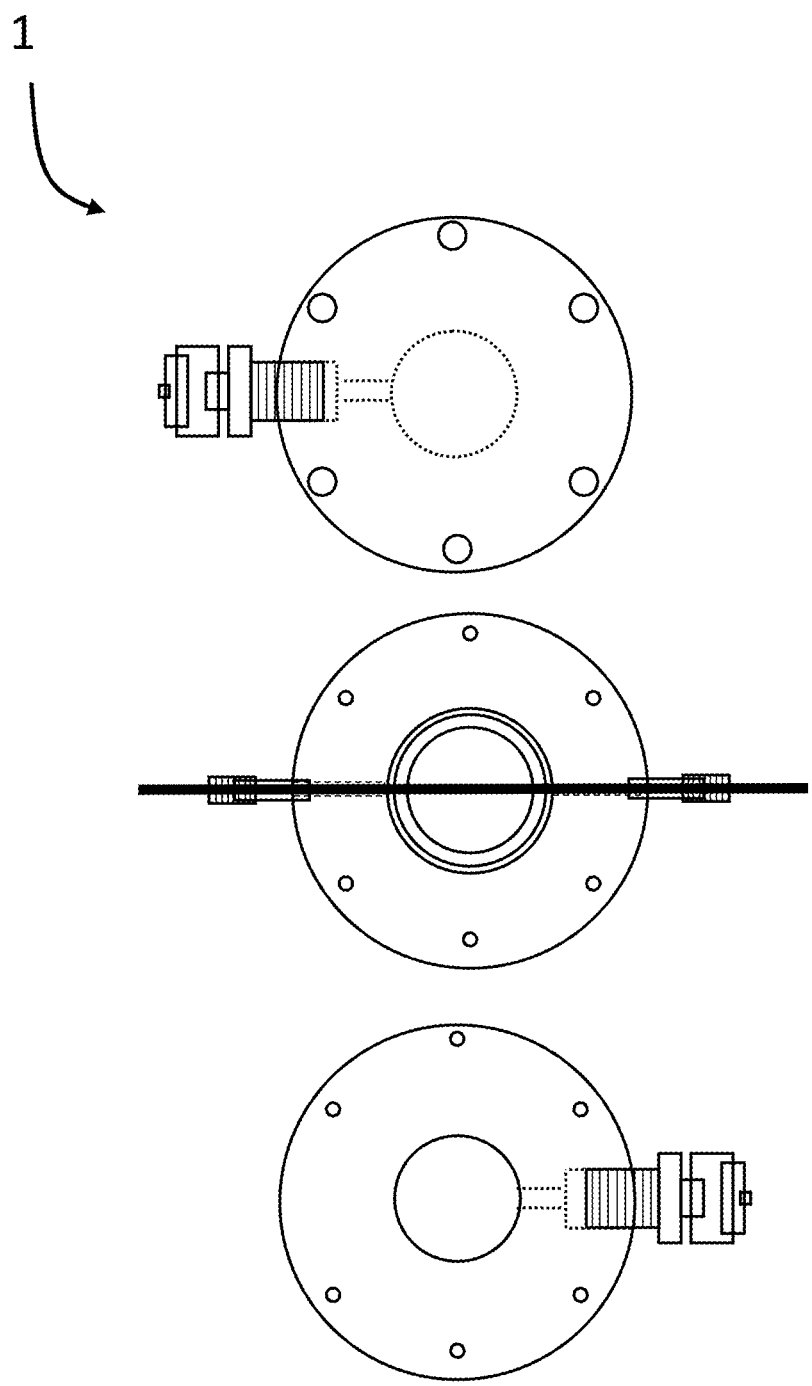
FIG. 9 shows the parts of a Reactor and Permeation Testing Module fabricated for ALD.
Figure 10:
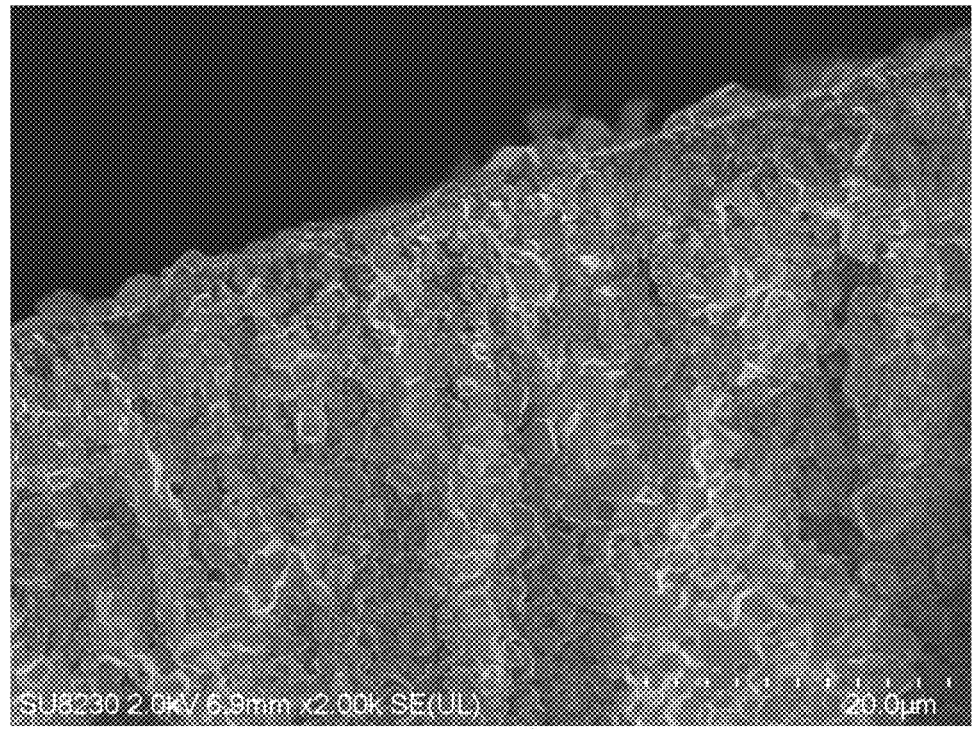
FIG. 10 shows a cross-sectional SEM image of ZIF-8 grown on α-alumina hollow fiber.

Ligand Vapor Induced ZIF-8 Growth:

The prepared alumina hollow fiber was mounted on the developed module 1 shown in FIG. 9, and the end was sealed with epoxy. The module 1 can be both reactor and permeation testing module. ZnO layer was deposited on the outer surface of hollow fiber using ALD. For the initial trial, we have tried 50 cycles of ALD ZnO coating. Then, the ZnO coated fiber was exposed to ligand vapor for 12 h at the temperature of 120° C. using modules. Fabricated Membrane was then solvent exchanged with MeOH for 2 h followed by natural drying. SEM image of the ZIF-8 membrane grown on the alumina hollow fiber can be found in FIG. 10. Membrane performance was measured after proper degassing step (5 hr, 120° C.). Fabricated ZIF-8 membrane shows the C$_3$H$_6$ permeance of 4.8E-9 mol/s·m$^2$·pa with the C$_3$H$_6$/C$_3$H$_8$ separation factor of 21. This initial trial of ZIF-8 membrane growth was performed on α-alumina fiber so we can observe deep penetration of ZnO layer (20~30 μm) due to the large pore size of α-alumina (200 nm) compared to T-alumina (20 nm). We can expect much improved performance with T-alumina coated hollow fiber support.

Figure 11:
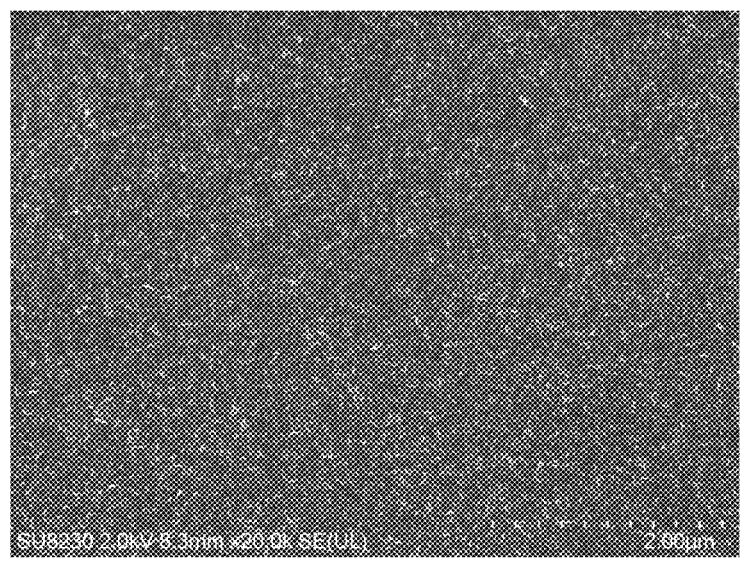
FIG. 11 shows a surface SEM image of γ-alumina coated on α-alumina hollow fiber.
Figure 12:
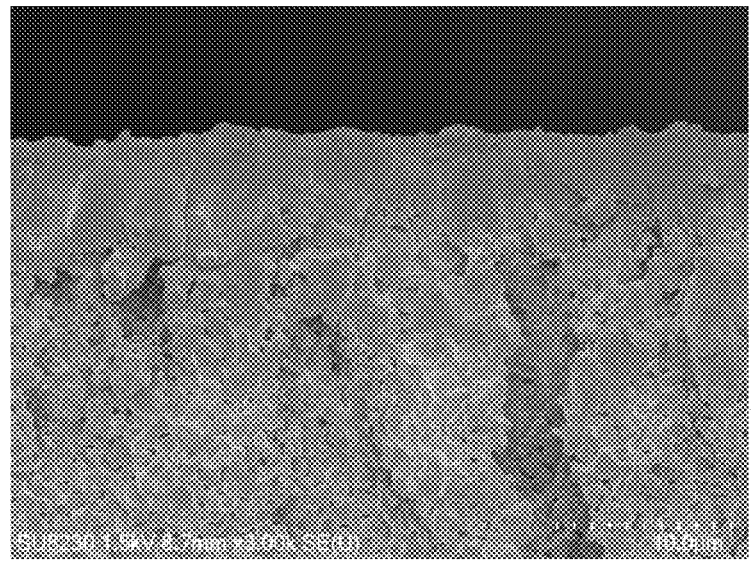
FIG. 12 shows a cross-section SEM image of γ-alumina coated on α-alumina hollow fiber.

Preparation of Gamma Alumina Layer and ZIF-8 Membrane:

A gamma-alumina layer was coated on the outer surface of the alumina hollow fiber by a dip-coating method. The fibers after coating were sintered at 450 degree C. for 3 hours. The fiber was coated with 20 cycles ZnO ALD and treated with 2-methylimidazole vapor at 120° C. for 12 hours to obtain ZIF-8 membranes. The prepared ZIF-8 membrane showed a propylene permeance of ~20 GPU and a separation factor of ~10. A surface SEM image of the γ-alumina coated on α-alumina hollow fiber is shown in FIG. 11 and FIG. 12 shows a cross-section SEM image of γ-alumina coated on α-alumina hollow fiber.

ZIF-67 Membrane Made by LIPS Method

ZIF-67 is a Co-substituted ZIF-8 structure. It has a similar topology as ZIF-8. Both ZIF-67 and ZIF-8 have 2-methylimidazole as the organic ligand. The metal center for ZIF-67 is cobalt, as compared to the Zn for ZIF-8.

Cobalt oxide (CoO or $Co_3O_4$) is deposited inside the pores of a porous support by atomic layer deposition (ALD) process. The ALD is conducted at a temperature ranging from room temperature to 300 degree C. using cobalt precursors and oxidant precursors. Examples of cobalt precursors include cobaltocene and dicobalt octacarbonyl. Examples of oxidant precursors include water and ozone. The number of deposition cycles varies from 1 to 1000 to change the amount of metal oxide deposited. The metal oxide deposited will cause a significant reduction to the gas permeance of the support, and the support is not selective to propylene/propane during the ALD process.

After the ALD, the support with Co deposited is treated with 2-methylimidazole ligand vapor to convert the cobalt oxide to ZIF-67. The same vapor treatment procedures used for ZIF-8 membrane synthesis can be used here for ZIF-67 membrane.

MOF Membranes (Using UiO-66) Made by LIPS Method

The framework of UiO-66 consists of $[Zr_6O_4(OH)_4]$ clusters and 1,4-benzenedicarboxylic acid (terephthalic acid) as the linker.

To make UiO-66 membrane by LIPS method, $ZrO_2$ is deposited inside the pores of a porous support by atomic layer deposition (ALD) process. The ALD is conducted at a temperature ranging from room temperature to 300 degree C. using zirconium precursors and oxidant precursors. Examples of zirconium precursors include tetrakis (dimethylamido) zirconium(IV). Examples of oxidant precursors include water and ozone. The number of deposition cycles varies from 1 to 1000 to change the amount of metal oxide deposited. The metal oxide deposited will cause a significant reduction to the gas permeance of the support.

After the ALD, the support with $ZrO_2$ deposited is treated with terephthalic acid ligand vapor to convert the $ZrO_2$ to UiO-66. Similar vapor treatment procedures used for ZIF-8 membrane can be used here for UiO-66 membrane.

LIPS Method Using Liquid Phase Synthesis

The ligand treatment process can also be performed in a liquid phase. Using ZIF-8 as an example, in a typical experiment, the support after ZnO deposition is brought in contact with a solution that contains solvents and 2-methylimidazole ligands. The concentration of 2-methylimidazole can vary from 0.01 mM to 100 M. The solvent can be water, methanol, dimethylformamide, etc. The reaction can be carried out at a temperature ranging from room temperature to 200 degree C. for a certain period of time to convert the ZnO to the selective ZIF-8 phase.

LIPS Method Using Supercritical $CO_2$ as the Synthesis Medium

The ligand treatment process can also be performed in a supercritical $CO_2$ phase. Supercritical $CO_2$ (sc$CO_2$) can be used to solubilize the solid ligands that are non-volatile such as carboxylate ligands and other azolate ligands. It has been reported that MOFs and ZIFs can be synthesized using sc$CO_2$ or combinations of sc$CO_2$ and co-solvents (Table 4). For example, sc$CO_2$ has been used as the single solvent for the synthesis of MOF crystals, such as ZIF-8 and HKUST-1,[24-26] suggesting the good solubility of the ligands including the non-volatile benzene-1,3,5-tricarboxylic acid (melting point: ~375° C.) in sc$CO_2$. In addition, many aromatic carboxylic acid compounds were reported to be soluble in sc$CO_2$. Despite the high pressures required, earlier attempts to make selective metal membranes by reactive deposition using supercritical fluids indicate feasibility. [29] If successful, the use of sc$CO_2$ will provide a novel general method for making MOF membranes.

TABLE 4

Synthesis of MOFs and ZIFs using sc$CO_2$ or sc$CO_2$ with co-solvent.

| MOF | Metal precursor | Ligand | Solvent |
| --- | --- | --- | --- |
| ZIF-8[23-26] | $Zn(acac)_2 \cdot xH_2O$ | 2-methylimidazole | sc$CO2$ + ionic liquid |
|  | $Zn(acac)_2 \cdot xH_2O$ |  | sc$CO_2$ |
|  | $Zn(acac)_2 \cdot xH_2O$ |  | sc$CO_2$ |
|  | ZnO |  | sc$CO_2$ |
| MIL-88B(Fe)[24] | $Fe(NO_3)_3 \cdot 9H_2O$ | Benzene-1,4-dicarboxylic acid | sc$CO_2$ + 2% v/v dioxane |
| MIL-100(Fe)[23] | $Fe(NO_3)_3 \cdot 9H_2O$ | Benzene-1,3,5-tricarboxylic acid | sc$CO_2$ + ionic liquid |
| Mn-BTC[27] | $MnCl_2$ | Benzene-1,3,5-tricarboxylic acid | $CO_2$ (not sc$CO_2$) + DMF |
| Mn-BDC[27] | $MnCl_2$ | Benzene-1,4-dicarboxylic acid | $CO_2$ + DMF |
| HKUST-1[23, 26-28] | $CU(OAC)_2 \cdot H_2O$ | Benzene-1,3,5-tricarboxylic acid | sc$CO_2$ + DMF, sc$CO_2$ + DMAc, sc$CO_2$ + NMP |
|  | $Cu(NO_3)_2 \cdot 2.5H_2O$ |  | sc$CO_2$ + DMSO + MeOH |
|  | $Cu(NO_3)_2 \cdot 3H_2O$ |  | sc$CO_2$ + ionic liquid |
|  | $Cu(CO_2CH_3)_2 \cdot H_2O$ |  | sc$CO_2$ |

*DMF: Dimethylformamide,
DMAc: Dimethylacetamide,
DMSO: Dimethyl sulfoxide,
MeOH: Methanol The prepared ZIF-8 membranes could also be used for hydrogen separation, natural gas components processing, butane isomers separation, ethylene/ethane separation and butene/butane separation.

Figure 13:
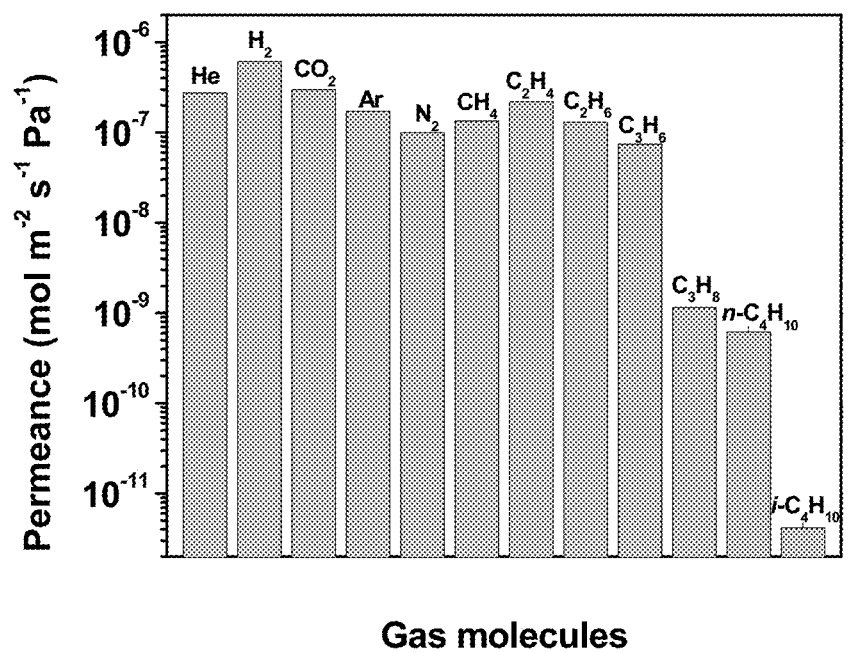
FIG. 13 shows the results for single component gas permeance of different gas molecules.

FIG. 13 shows the results of single component gas permeance of difference gas molecules in a ZIF membrane made in alumina support using ZnO deposited by ALD and vapor treatment with methylimidazole. Table 5 shows ideal selectivity for different gas pairs for this membrane.

TABLE 5

| Gas Pairs | Ideal Selectivity |
| --- | --- |
| He/i-$C_4H_{10}$ | ~60000 |
| $H_2$/i-$C_4H_{10}$ | ~140000 |
| $H_2$/$C_3H_8$ | 530 |
| $CH_4$/$C_3H_8$ | 117 |
| $C_2H_6$/$C_3H_8$ | 113 |
| n-$C_4H_{10}$/i-$C_4H_{10}$ | 148 |

In summary, it has been demonstrated that (i) ZIFs can be deposited by an all-vapor method inside mesopores to form a nanocomposite; and (ii) nanocomposite membranes consisting of a ZIF deposited inside mesopores can be highly selective and exhibit high flux making it attractive for commercial uses including propylene/propane separation.

Moreover, the nanocomposite membrane and its fabrication method disclosed here have additional advantages that are attractive for scale-up and commercialization. Membrane fabrication cost and scalability are the biggest barriers that limit the industrial application of inorganic membranes for gas separation. The disclosed method avoids the use of solution completely and it only requires a very small amount of materials for the gas-phase membrane synthesis. This is advantageous because the ligands used for the synthesis of ZIFs are typically very expensive. Therefore, significant cost savings can be achieved by our membrane fabrication method. In addition, the ALD deposition technique, γ-alumina support and other mesoporous supports are already commercially available.

The method demonstrated here for ZnO and a certain imidazole ligand can be extended using different oxides like cobalt oxides and other azole ligands, like benzimidazole, to create coordination compounds with different pore structure and molecular sieve properties.

The deposition method can be varied and the obtained nanocomposites can be extended beyond what is discussed above. For example, a vapor-based process similar to the one described above can be performed, where ALD is used to form zinc oxide or other oxides (for example cobalt oxide or indium oxide or an oxide of Fe, In, Cu, Mn, Li, B, Cd, Hg, Pr, Mg, Al, Zr, Si, Hf, Ti and Ta) within inorganic mesoporous supports (examples of mesoporous supports include gamma alumina, mesoporous silica, mesoporous zirconia, titania, a film made of Stober silica nanoparticles or other nanoparticles, etc.); and the deposited oxides are then treated with vapors of an azole based ligand (for example methyl imidazole, benzimidazole, nitroimidazole, dichloroimidazole, imidazole-2-carboxylic acid) to convert the deposited oxides completely or partially to a metal imidazolate coordination compound or a mixture of imidazolate coordination compounds. Examples of coordination compounds are amorphous zeolitic imidazolate frameworks (amorphous ZIFs), and crystalline imidazolate frameworks like ZIF-1, ZIF-2, ZIF-3, ZIF-4, ZIF-5, ZIF-6, ZIF-7, ZIF-8, ZIF-9, ZIF-10, ZIF-11, ZIF-12 (the crystal structures of the above crystalline ZIFs is described in reference [25]). This way, a continuous ZIF deposit is formed within the mesoporous support blocking its mesopores and allowing for selective transport of molecules through the deposited ZIF.

The following references are incorporated herein by reference thereto to the extent they do not conflict with the instant disclosure.

REFERENCES

[1] R. B. Eldridge, Olefin paraffin separation technology—a review. *Industrial and Engineering Chemistry Research* 1993, 32, 2208-2212.

[2] A. Motelica, O. S. L. Bruinsma, R. Kreiter, M. den Exter, J. F. Vente, Membrane retrofit option for paraffin/olefin separation—a technoeconomic evaluation. *Industrial and Engineering Chemistry Research* 2012, 51, 6977-6986.

[3] J. A. Caballero, I. E. Grossmann, M. Keyvani, E. S. Lenz, Design of hybrid distillation-vapor membrane separation systems. *Ind. Eng. Chem. Res.* 2009, 48 9151-9162.

[4] Y. C. Pan, T. Li, G. Lestari, Z. P. Lai, Effective separation of propylene/propane binary mixtures by ZIF-8 membranes. *Journal of Membrane Science* 2012, 390, 93-98.

[5] H. T. Kwon, H. K. Jeong, A. S. Lee, H. S. An, J. S. Lee, Heteroepitaxially grown zeolitic imidazolate framework membranes with unprecedented propylene/propane separation performances. *Journal of the American Chemical Society* 2015, 137, 12304-12311.

[6] Zhiping Lai, Yichang Pan. Zeolitic imidazolate framework membranes and methods of making and using same for separation of c2- and c3+ hydrocarbons and separation of propylene and propane mixtures. US patent, US20120310018A1, 2012-12-06.

[7] Hae-Kwon Jeong, Hyuk Taek Kwon. Methods to Enhance Separation Performance of Metal-Organic Framework Membranes. US patent, US20150251139A1, 2015-09-10.

[8] A. J. Brown, N. A. Brunelli, K. Eum, F. Rashidi, J. R. Johnson, W. J. Koros, C. W. Jones, S. Nair, Interfacial microfluidic processing of metal-organic framework hollow fiber membranes. *Science* 2014, 345, 72-75.

[9] Sankar Nair, Andrew Brown, Christopher W. Jones. Metal-organic framework supported on porous polymer. US patent, WO2013177199A1, 2013-11-28.

[10] Sankar Nair, Kiwon Eum, Christopher W. Jones, Ali Rownaghi. High efficiency, high performance metal-organic framework (mof) membranes in hollow fibers and tubular modules. US patent, US20160184798A1, 2016-06-30.

[11] Anne Giroir-Fendler, Anne Julbe, John D. F. RAMSAY, Jean-Alain Dalmon. Porous composite inorganic material, particularly in membrane form, and method for making same. WO1995029751A1. 1995-11-09.

[12] Katsuki Kusakabe, Yasuhisa Hasegawa, Shigeharu Morooka, Yasunori Ando. Zeolite membranes for selective oxidation of carbon monoxide in mixed hydrogen gas source. US patent, US20030168407A1, 2003-09-11.

[13] E. Jang, E. Kim, H. Kim, T. Lee, H. J. Yeon, Y. W. Kim, J. Choi, Formation of ZIF-8 membranes inside porous supports for improving both their $H_2$/$CO_2$ separation performance and thermal/mechanical stability. *Journal of Membrane Science* 2017, 540, 430-439.

[14] M. Drobek, M. Bechelany, C. Vallicari, A. A. Chaaya, C. Charmette, C. Salvador-Levehang, P. Miele, A. Julbe, An innovative approach for the preparation of confined ZIF-8 membranes by conversion of ZnO ALD layers. *Journal of Membrane Science* 2015, 475, 39-46.

[15] S. C. Hess, R. N. Grass, W. J. Stark. MOF Channels within Porous Polymer Film: Flexible, Self-Supporting ZIF-8 Poly (ether sulfone) Composite Membrane. *Chemistry of Materials* 2016, 28, 7638-7644.

[16] C. L. Kong, H. B. Du, L. Chen, B. L. Chen, Nanoscale MOF/organosilica membranes on tubular ceramic substrates for highly selective gas separation. *Energy Environ. Sci.* 2017, 10, 1812-1819.

[17] I. Stassen, M. Styles, G. Grenci, H. Van Gorp, W. Vanderlinden, S. De Feyter, P. Falcaro, D. De Vos, P. Vereecken, R. Ameloot. Chemical vapour deposition of zeolitic imidazolate framework thin films. *Nature materials* 2016, 15, 304-310.

[18] Ivo Stassen, Rob Ameloot, Dirk De Vos, Philippe M. Vereecken. Method of Producing a Thin Metal-Organic Framework Film Using Vapor Phase Precursors. US patent, US20170198393A1. 2017-07-13.
[19] H. T. Kwon, H. K. Jeong, A. S. Lee, H. S An, T. Lee, E. Jang, J. S. Lee, J. Choi. Defect-induced ripening of zeolitic-imidazolate framework ZIF-8 and its implication to vapor-phase membrane synthesis. *Chemical Communications* 2016, 52, 11669-11672.
[20] W. Li, P. Su, Z. Li, Z. Xu, F. Wang, H. Ou, J. Zhang, G. Zhang, E. Zeng. Ultrathin metal-organic framework membrane production by gel-vapour deposition. *Nature Communications* 2017, 406, 1-8.
[21] K. V. Agrawal, B. Topuz, Z. Jiang, K. Nguenkam, B. Elyassi, L. F. Francis, M. Tsapatsis, M. Navarro, Solution-processable exfoliated zeolite nanosheets purified by density gradient centrifugation. *AIChE Journal* 2013, 59, 3458-3467.
[22] C. H. Chang, R. Gopalan, Y. S. Lin. A comparative study on thermal and hydrothermal stability of alumina, titania and zirconia membranes. *Journal of Membrane Science* 1994, 91, 27-45.
[23] H. Tao, T. D. Bennett, Y. Yue, Melt-quenched hybrid glasses from metal-organic frameworks, *Adv. Mater.* 2017, 29, 1601705.
[24] Mark D. Allendorf, Vitalie Stavila. Nanoporous films: From conventional to the conformal. *Nature materials* 2016, 15, 255-257.
[25] K. S. Park, Z. Ni, A. P. Cote, J. Y. Choi, R. Huang, F. J. Uribe-Romo, H. K. Chae, M. O'Keeffe, O. M. Yaghi, Exceptional chemical and thermal stability of zeolitic imidazolate frameworks, *Proc. Natl. Acad. Sci. USA* 2006, 103, 10186-10191.
[26] Y. Pan, W. Liu, Y. Zhao, C. Wang, Z. Lai. Improved ZIF-8 membrane: effect of activation procedure and determination of diffusivities of light hydrocarbons. *J. Membr. Sci.* 2015, 493, 88-96.
[27] J. Yu, Y. Pan, C. Wang, Z. Lai, ZIF-8 membranes with improved reproducibility fabricated from sputter-coated ZnO/alumina supports. *Chem. Eng. Sci.* 2016, 141, 119-124.
[28] D. Liu, X. Ma, H. Xi, Y. S. Lin, Gas transport properties and propylene/propane separation characteristics of ZIF-8 membranes. *J. Membr. Sci.* 2014, 451, 85-93.
[29] N. Hara, M. Yoshimune, H. Negishi, K. Haraya, S. Hara, T. Yamaguchi, Diffusive separation of propylene/propane with ZIF-8 membranes, *J. Membr. Sci.* 2014, 450, 215-223.
[30] N. Hara, M. Yoshimune, H. Negishi, K. Haraya, S. Hara, T. Yamaguchi, *J. Chem. Eng. Jpn.* 2014, 47, 770-776.
[31] N. Hara, M. Yoshimune, H. Negishi, K. Haraya, S. Hara, T. Yamaguchi, *Microporous Mesoporous Mater.* 2015, 206, 75-80.
[32] N. Hara, M. Yoshimune, H. Negishi, K. Haraya, S. Hara, T. Yamaguchi. Effect of temperature on synthesis of zif-8 membranes for propylene/propane separation by counter diffusion method. *J. Jpn. Pet. Inst.*, 2015, 58, 237-244.
[33] N. Hara, M. Yoshimune, H. Negishi, K. Haraya, S. Hara, T. Yamaguchi. Effect of solution concentration on structure and permeation properties of ZIF-8 membranes for propylene/propane separation. *J. Chem. Eng. Jpn.* 2016, 49, 97-103.
[34] S. Tanaka, K. Okubo, K. Kida, M. Sugita, T. Takewaki, Grain size control of ZIF-8 membranes by seeding-free aqueous synthesis and their performances in propylene/propane separation. *Journal of Membrane Science* 2017, 544, 306-311.
[35] H. T. Kwon, H. K. Jeong, In situ synthesis of thin zeolitic-imidazolate framework ZIF-8 membranes exhibiting exceptionally high propylene/propane separation, *J. Am. Chem. Soc.* 2013, 135, 10763-10768.
[36] H. T. Kwon, H. K. Jeong, Highly propylene-selective supported zeolite-imidazolate framework (ZIF-8) membranes synthesized by rapid microwave-assisted seeding and secondary growth. *Chem. Commun.* 2013, 49, 3854-3855.
[37] H. T. Kwon, H. K. Jeong, Improving propylene/propane separation performance of zeolitic-imidazolate framework ZIF-8 Membranes. *Chem. Eng. Sci.* 2015, 124, 20-26.
[38] K. Eum, C. Ma, A. A. Rownaghi, C. W. Jones, S. Nair, ZIF-8 Membranes via interfacial microfluidic processing in polymeric hollow fibers: efficient propylene separation at elevated pressures. *ACS Appl. Mater. Interfaces,* 2016, 8, 25337-25342.
[39] K. Eum, A. Rownaghi, D. Choi, R. R. Bhave, C. W. Jones and S. Nair, Fluidic Processing of High-Performance ZIF-8 Membranes on Polymeric Hollow Fibers: Mechanistic Insights and Microstructure Control. *Adv. Funct. Mater.* 2016, 26, 5011-5018.

Thus, embodiments of nanocomposite membranes and methods of making the same are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

The invention claimed is:
1. A method for fabricating a nanocomposite comprising the steps of:
   depositing an oxide in the pores of a mesoporous oxide; and
   further treating the resulting material with vapor, liquid, or supercritical $CO_2$ comprising an azole-based compound, a carboxylate based compound, or a combination thereof.
2. The method of claim 1, wherein the oxide is deposited using atomic layer deposition (ALD).
3. The method of claim 2, where the oxide deposited comprises Zn, Co, Fe, In, Cu, Mn, Li, B, Cd, Hg, Pr, Mg, Ni, Al, Zr, Si, Hf, Ti and Ta oxides or a mixture thereof.
4. The method of claim 1, where the azole based compound comprises any of imidazole, methyl-imidazole, benzimidazole, nitroimidazole, 2-chloro-1H-imidazole, dichloroimidazole, imidazole-2-carboxylic acid, 5,6-dimethylbenzimidazole, imidazole-2-carboxaldehyde, 2-ethylimidazole, 4-bromoimidazolate, 4,5-dichloroimidazolate, dimethylimidazolate or a mixture thereof.
5. The method of claim 1, where the resulting material is treated with vapor comprising an azole-based compound, a carboxylate based compound, or a combination thereof.

* * * * *